United States Patent
Saha et al.

(10) Patent No.: US 10,330,734 B2
(45) Date of Patent: Jun. 25, 2019

(54) DETECTION AND/OR PREDICTION OF PLATING EVENTS IN AN ENERGY STORAGE DEVICE

(71) Applicant: Palo Alto Research Center Incorporated, Palo Alto, CA (US)

(72) Inventors: Bhaskar Saha, Redwood City, CA (US); Anurag Ganguli, Milpitas, CA (US); Ajay Raghavan, Mountain View, CA (US); Peter Kiesel, Palo Alto, CA (US); Kyle Arakaki, Mountain View, CA (US); Julian Schwartz, Oakland, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 8 days.

(21) Appl. No.: 15/652,973

(22) Filed: Jul. 18, 2017

(65) Prior Publication Data
US 2019/0025376 A1    Jan. 24, 2019

(51) Int. Cl.
*G01R 31/392* (2019.01)
*G01R 31/3828* (2019.01)
(Continued)

(52) U.S. Cl.
CPC ........ *G01R 31/3828* (2019.01); *G01R 15/241* (2013.01); *G01R 31/367* (2019.01);
(Continued)

(58) Field of Classification Search
CPC ............ G01R 31/3651; G01R 31/3675; G01R 31/3679
(Continued)

(56) References Cited

U.S. PATENT DOCUMENTS

| | | | | | |
|---|---|---|---|---|---|
| 5,642,030 A | * | 6/1997 | Seelye | .................. | H02J 7/0031 320/101 |
| 5,698,340 A | * | 12/1997 | Xue | ........................ | H01M 4/36 423/594.15 |

(Continued)

OTHER PUBLICATIONS

Bae et al. Monitoring the Strain Evolution of Lithium-Ion Battery Electrodes using an Optical Fiber Braff Grating Sensor. https://onlinelibrary.wiley.com/doi/pdf/10.1002/ente.201500514 (Year: 2016).*

(Continued)

*Primary Examiner* — Patrick Assouad
*Assistant Examiner* — Demetrius R Pretlow
(74) *Attorney, Agent, or Firm* — Hollingsworth Davis, LLC

(57) ABSTRACT

A system detects and/or predicts metal ion plating events of a metal ion energy storage device. The system includes an optical sensor disposed internally within or externally on a metal ion energy storage device wherein the optical sensor has an optical output that changes in response to strain within a metal ion energy storage device. A current sensor senses current through the metal ion energy storage device. Plating detection circuitry measures a wavelength shift in the optical output of the optical sensor and estimates a state of charge (SOC) of the metal ion energy storage device based on the current. An expected wavelength shift is determined from the estimated SOC. A plating event can be detected and/or predicted based on the difference between the expected wavelength shift and the measured wavelength shift.

22 Claims, 18 Drawing Sheets

(51) Int. Cl.
*H01M 10/0525* (2010.01)
*H01M 10/42* (2006.01)
*H01M 10/44* (2006.01)
*H01G 11/08* (2013.01)
*H01G 11/06* (2013.01)
*G01R 15/24* (2006.01)
*G01R 31/367* (2019.01)
*G01R 31/374* (2019.01)
*H01G 11/14* (2013.01)

(52) U.S. Cl.
CPC ......... *G01R 31/374* (2019.01); *G01R 31/392* (2019.01); *H01G 11/06* (2013.01); *H01G 11/08* (2013.01); *H01M 10/0525* (2013.01); *H01M 10/4257* (2013.01); *H01M 10/44* (2013.01); *H01G 11/14* (2013.01)

(58) Field of Classification Search
USPC .......................................................... 324/431
See application file for complete search history.

(56) References Cited

U.S. PATENT DOCUMENTS

| | | | |
|---|---|---|---|
| 6,316,144 B1 * | 11/2001 | Xue | H01M 4/133 423/275 |
| 9,203,122 B2 * | 12/2015 | Raghavan | G01L 1/246 |
| 9,209,494 B2 | 12/2015 | Kiesel et al. | |
| 9,267,993 B2 | 2/2016 | Farmer et al. | |
| 9,553,465 B2 | 1/2017 | Raghavan et al. | |
| 9,583,796 B2 | 2/2017 | Saha et al. | |
| 2007/0134132 A1 * | 6/2007 | Tani | G01B 11/0625 422/82.05 |
| 2011/0148359 A1 * | 6/2011 | Noguchi | H02J 7/0047 320/134 |
| 2014/0062415 A1 * | 3/2014 | Barsukov | H02J 7/00 320/134 |
| 2014/0203783 A1 * | 7/2014 | Kiesel | H01M 10/42 320/134 |
| 2015/0111077 A1 * | 4/2015 | Paik | H01M 2/0285 429/91 |
| 2015/0303723 A1 | 10/2015 | Raghavan et al. | |
| 2017/0190262 A1 * | 7/2017 | Jin | B60L 11/1861 |
| 2017/0203667 A1 * | 7/2017 | He | B60L 11/1864 |
| 2017/0294686 A1 * | 10/2017 | Arnold | H01M 10/488 |
| 2017/0309973 A1 * | 10/2017 | Haug | G01B 7/24 |
| 2018/0034284 A1 * | 2/2018 | Yebka | H02J 7/007 |
| 2018/0151914 A1 * | 5/2018 | Zimmerman | H01M 4/505 |

OTHER PUBLICATIONS

Burns et al., "In-Situ Detection of Lithium Plating Using High Precision Coulometry", Journal of the Electrochemical Society, 162 (6), 2015, pp. A959-A964.

Uhlmann et al., "In situ detection of lithium plating on graphite via reference electrodes and optical test-cells", The Electrochemical Society, 223$^{rd}$ ECS Meeting, Abstract No. 114, 2013, 1 page.

* cited by examiner

DETECTION AND/OR PREDICTION OF PLATING EVENTS IN AN ENERGY STORAGE DEVICE

STATEMENT REGARDING FEDERALLY SPONSORED RESEARCH AND DEVELOPMENT

This invention is based upon work supported by ARPA-E under Award No. DE-AR0000274. The Government has certain rights to this invention.

TECHNICAL FIELD

This application relates generally to techniques for monitoring metal ion energy storage devices, including detecting or predicting plating events. The application relates to devices, systems, and methods pertaining to such techniques.

BACKGROUND

Metal ion plating in energy storage devices can degrade the device's performance and life. As a first order phenomenon, metal ion plating reduces the number of active ions available for charge transport, reducing the capacity of the energy storage device. The plated metal can also cover up some of the reaction sites on the anode, thus increasing resistance and consequently increasing the operational temperature inside the energy storage device. Additionally, deposited metal can lead to dendrite formation inside the energy storage device which can eventually puncture the separator layer and create an internal short between the anode and the cathode. This catastrophic failure mode has the potential to result in fires and explosions with severe safety consequences.

SUMMARY

Some embodiments involve a system for detecting and/or predicting metal ion plating events within an energy storage device. The system includes an optical sensor disposed internally within or externally on the energy storage device and having optical output that changes in response to strain within the energy storage device. A current sensor detects current through the energy storage device. Plating detection circuitry measures a wavelength shift in the optical output of the optical sensor. The plating detection circuitry estimates a state of charge (SOC) of the energy storage device based on the current. The plating detection circuitry determines an expected wavelength shift from the estimated SOC and determines a difference between the expected wavelength shift and the measured wavelength shift. A plating event can be detected or predicted based on the difference between the expected wavelength shift and the measured wavelength shift.

Some embodiments are directed to a method for detecting or predicting metal ion plating in an energy storage device. The method includes measuring the wavelength shift in an output of an optical sensor disposed internally or externally within the energy storage device wherein the wavelength shift is responsive to internal strain within the energy storage device. The state of charge (SOC) of the energy storage device is estimated, e.g., by the coulomb counting method. An expected wavelength shift is determined based on the estimated SOC. The difference between the expected wavelength shift and the measured wavelength shift is determined. Metal ion plating within the energy storage device is detected and/or predicted based on the difference.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DESCRIPTION

Figure 1A:
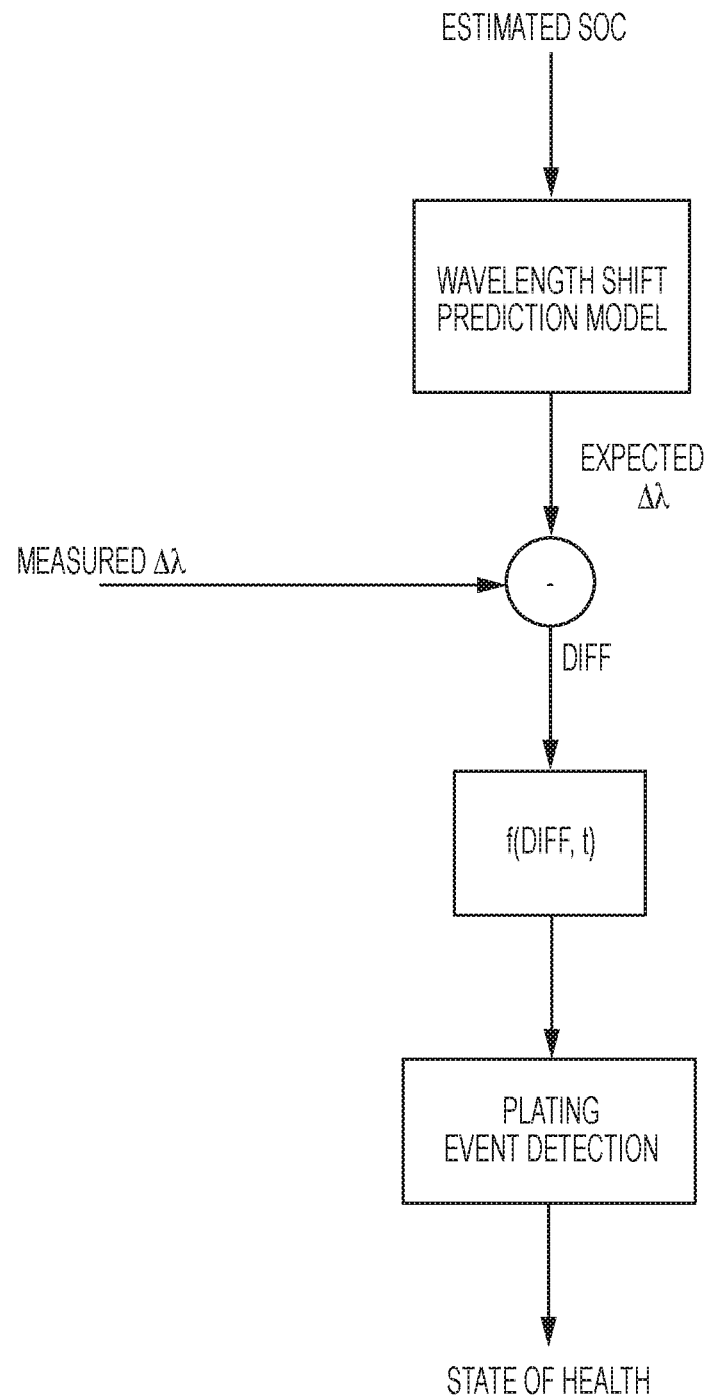
FIG. 1A is a diagram illustrating a process of detecting or predicting metal ion plating events in accordance with some embodiments described herein.

Embodiments described in this disclosure involve techniques for detecting and/or predicting metal ion plating events in metal ion energy storage devices. Examples of metal ion energy storage devices include, but are not limited to, supercapacitors and battery cells. The condition of the metal ion energy storage device, e.g., state of health, projected end of life and/or remaining useful life, can additionally be determined based on the number and/or severity of the detected metal ion plating events.

Examples of supercapacitors that can experience metal ion plating events include electrochemical pseudocapacitors and hybrid capacitors. Pseudocapacitance involves Faradaic electron charge-transfer with redox reactions, intercalation or electrosorption. Pseudocapacitors use metal oxide or conducting polymer electrodes that rely on electrochemical pseudocapacitance in addition to electrostatic capacitance. Hybrid capacitors use electrodes with differing characteristics. For example, one electrode may provide primarily electrostatic capacitance and the other electrode may provide primarily electrochemical capacitance. Examples of metal ion battery cells include lithium ion, sodium ion, and aluminum ion battery cells, among others.

Metal ions provide a charge transport species inside a metal ion energy storage device. A well known example of a metal ion energy storage device is the lithium ion battery cell which is used as an example in this disclosure to explain the process of metal ion plating and the to provide illustrations of the processes, devices, and systems disclosed herein. A lithium ion battery cell comprises a positive electrode or cathode made from a lithium salt compound (including but not limited to $LiCoO_2$, $LiFePO_4$, $Li_2TiO_3$, and $LiNi_{0.5}Mn_{1.5}O_4$), a negative electrode or anode made typically from graphite, an electrolyte made from molten lithium salt (such as LiPF6), and a polymer separator layer. During charging the cathode gives up some of its positively charged Li+ ions, which move through the electrolyte to the anode and remain embedded there. This embedding process is called lithiation or Lithium intercalation. The battery takes in and stores energy during this process. When the battery is discharging, the Li+ ions move out of the anode via a process called delithiation or de-intercalation, back across the electrolyte and the separator to the positive electrode, producing the energy that powers the battery. In both cases, electrons flow in the opposite direction to the ions around the outer circuit. Electrons do not flow through the electrolyte due to the separator layer.

Since the Li-ions are the charge transport species inside the Li-ion battery cell, the number of active Li-ions provides a measure of the charge capacity of the battery. As the battery cycles through charge and discharge, this number is depleted via several electrochemical mechanisms. One such mechanism is lithium plating. When the charging current is very high, such as during regenerative braking in a battery-powered electric vehicle (EV), the transport rate of Li+ ions from the cathode through the electrolyte to the graphite anode exceeds the rate that those same ions can be inserted (intercalated) into the graphite structure. Under these conditions, Li+ ions may deposit as metallic Li in a process called lithium plating. The phenomena also occur for anodes made from materials other than graphite, such as silicon.

Metal ion plating can degrade the performance and life of a metal ion energy storage device in several ways. As a first order phenomena, metal-ion plating reduces the number of active metal ions available for charge transport. This irreversibly reduces the capacity of the metal ion energy storage device. The plated metal ion, e.g., lithium, can also cover up some of the reaction sites on the anode, thus increasing resistance and consequently operational temperature inside the energy storage device. And finally, deposited metal ions can lead to dendrite formation inside the energy storage device, which can eventually puncture the separator layer and create an internal short between the anode and the cathode. This catastrophic failure mode can result in fires and explosions with severe safety consequences.

Metal ion plating as a mechanism for degradation and failure is especially likely at low operating temperatures, because the designed alternative, intercalation into the graphite electrode, becomes too slow, and plating becomes a viable alternative. Additionally, metal ion plating also depends on the previous history, state of charge (SOC), and chemistry of the energy storage device. Previously, small amounts of lithium plating in Li ion batteries have been detected through high accuracy measurements of Coulombic efficiency in a lab setting.

In contrast to previous metal ion plating detection schemes, approaches described herein are directed to real time detection of metal ion plating events. The technique employed uses at least one optical sensor disposed within or bonded to the surface of the metal ion energy storage device on a fiber optic (FO) cable. The optical sensor may comprise any type of optical sensor that provides an optical output, including fiber Bragg grating (FBG) sensors and/or etalon or Fabry-Perot (FP) sensors; these sensors are collectively referred to herein as optical sensors.

The optical output of the strain sensor exhibits a wavelength shift in reponse to changes in strain within the metal ion energy storage device. Metal ion plating events are detected by measuring the wavelength shift of the optical strain sensor and comparing the measured wavelength shift to an expected wavelength shift that is predicted based on an estimation of the SOC of the energy storage device.

The diagram of FIG. 1A provides an overview of processes involved in detecting or predicting metal ion plating events. The process may determine the condition of the energy storage device based on detected metal ion plating events. As indicated in FIG. 1A, the SOC of the energy storage device can be estimated, e.g., by the coulomb counting method which measures inflowing and outflowing current through the energy storage device. The wavelength shift of the optical strain sensor changes as a function of charge state of the energy storage device. The expected wavelength shift for the estimated SOC is determined by a wavelength shift prediction model. The wavelength shift prediction model may be developed based on machine learning as discussed in more detail herein. The difference between the expected wavelength shift is compared to the measured wavelength shift which indicates the strain in the energy storage device. Since both strain and temperature cause the optical output of the strain sensor to shift in wavelength, the measured wavelength shift may be temperature-compensated. Metal ion plating events are detected or predicted based on the difference between the measured wavelength shift and the expected wavelength shfit. For example, a difference (diff) between the measured wavelength shift and the expected wavelength shift that is greater than a detection threshold value ($diff_d$>threshold value) can be used to indicate that a metal ion plating has occurred. A rate of change of the difference (diff) between the measured wavelength shift and the expected wavelength shift that is greater than a prediction threshold value ($diff_p$>threshold value) can be used to indicate that a metal ion plating is imminent.

In some embodiments, metal ion plating events are determined as a function, f(diff,t), of the difference between the measured wavelength shift and the expected wavelength shift with respect to time. The number and/or severity of the metal ion plating events can be evaluated. In some embodiments, the function f(diff,t) may be the moving average of the difference between the measured wavelength shift and the expected wavelength shift over time. In some embodiments, the function f(diff,t) may be the derivative of the difference between the measured wavelength shift and the expected wavelength shift with respect to time.

Detection of the metal ion plating events can be used to determine state of health indicators for the energy storage device, e.g., indicators expressed as how much of an energy storage device's useful lifetime has been consumed, cycle life of the energy storage device, capacity of the energy storage device, and/or amount of active metal ion present in the energy storage device. Detection of metal ion plating events can be used to predict the end of life and/or the remaining useful life of the energy storage device. Detection of the metal ion plating events can be used to determine state of health indicators for the energy storage device, e.g., indicators expressed as how much of the energy storage device's useful lifetime has been consumed, cycle life of the energy storage device, capacity of the energy storage device, and/or amount of active metal ion in the energy storage device.

Detection of plating events can be used to determine the amount or degree of plating within the energy storage device which in turn can be used to predict the end of life and/or the remaining useful life of the energy storage device and/or to provide other indicators of the state of health (SOH) of the energy storage device. As an example, the degree of metal ion plating can be estimated from the number of metal ino plating events and/or the severity of the metal ion plating events. For example, the number of metal ion plating events can be recorded by counting the number of times the threshold criteria for a metal ion plating event is detected. The severity of each plating event can be estimated from the amount of difference between the measured and expected wavelength shifts during a plating event, e.g., the peak value and/or cumulative difference between the measured and expected wavelength shift over time during the detected plating event. Predicting that a metal ion plating event is imminent may allow processes to be implemented to reduce the likelihood of metal ion plating, e.g., by reducing the current load on the energy storage device.

The degree of metal ion plating, which may be estimated from the deviation between the expected and measured wavelength shift curves indicate the percentage of recyclable ions still remaining. The remaining percentage is reflective of the present capacity of the energy storage device. Multiplying the remaining percentage by the original capacity of the energy storage device (Amp-hours) yields the state of health (SOH) of the energy storage device.

Figure 1B:
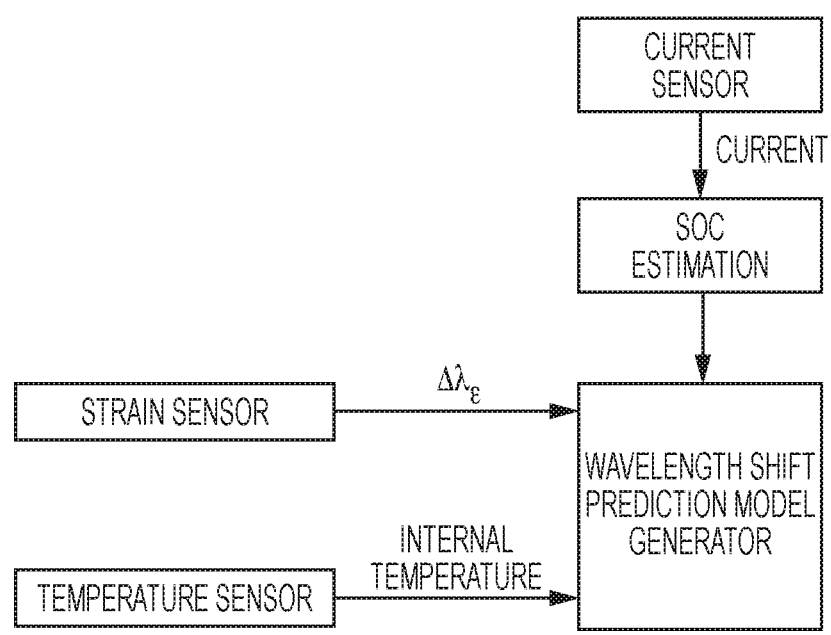
FIGS. 1B and 1C are diagrams providing additional details regarding the wavelength prediction model of FIG. 1A.
Figure 1C:
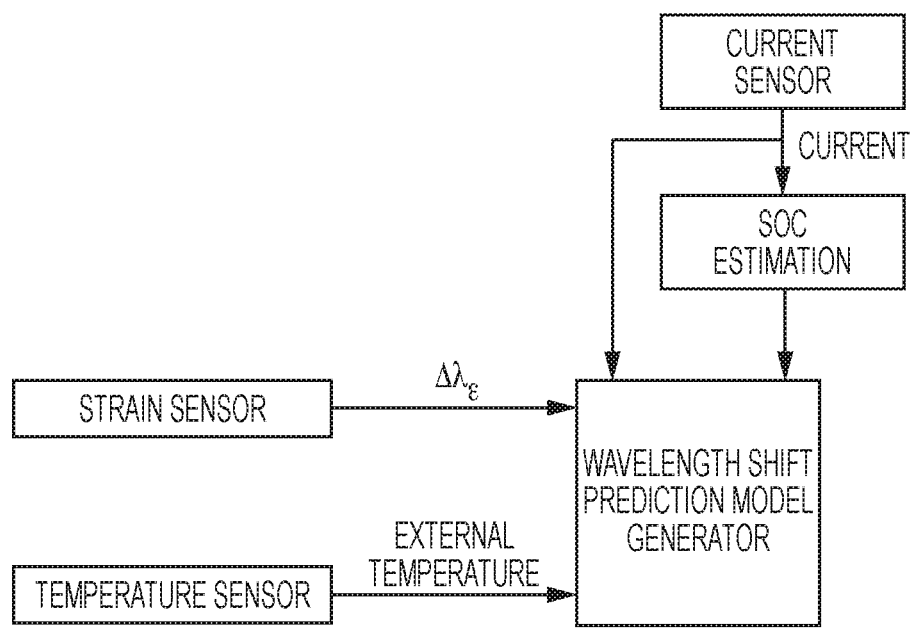

FIGS. 1B and 1C are diagrams providing additional details regarding the wavelength prediction model and how such a model may be developed. The wavelength prediction model provides an expected wavelength shift based on the present SOC of the energy storage device. The SOC of the energy storage device can obtained from sensing current through the energy storage device and applying the coulomb counting method. The wavelength prediction model can be developed by machine learning. For example, an energy storage device may be subjected to multiple charge training cycles multiple discharge training cycles during which the wavelength shift of the optical strain sensor is measured and the SOC is determined. The model is then determined by applying polynomial regression, or other statistical techniques, to the recorded wavelength shift vs. SOC data to find the best fit for the data.

In general, the wavelength shift of the optical sensor is dependent on temperature as well as strain. A change in temperature or strain from the baseline condition results in a shift in the spectrum of light reflected by the sensor. The strain response arises due to both the physical elongation of the sensor. The thermal response arises due to the inherent thermal expansion of the sensor material and the temperature dependence of the refractive index, n. Thus, the wavelength shift used to develop the wavelength shift prediction model may be temperature-compensated to reduce or eliminate the contribution of temperature changes to the wavelength shift. For example, as shown in FIG. 1B, the output of an internal temperature sensor, e.g., an optical temperature sensor, may be used to compensate the wavelength shift of the strain temperature for changes in temperature. In some embodiments both the internal optical strain sensor and the internal optical temperature sensor are disposed on the same FO cable as discussed in commonly owned U.S. Pat. No. 9,203,122 which is incorporated herein by reference. Alternatively, the internal optical strain sensor and the internal optical temperature sensor may be respectively disposed on separate FO cables.

In some embodiments, an external temperature sensor disposed outside the energy storage device may be used for temperature compensation of the internal strain sensor to develop the wavelength prediction model, as illustrated in FIG. 1C. However, temperature compensation using the output of the external temperature sensor alone may not be optimal, especially in high current loading conditions and/or thick cells, or other load scenarios where there is a considerable difference between internal and external cell temperature. In such scenarios, the temperature compensation based on an external temperature sensor can be enhanced by also taking into account the current through the energy storage device. In this scenario, the wavelength prediction model is developed by recording the wavelength shift of the internal strain sensor, the external temperature sensor, the current through the energy storage device, and the SOC, e.g., determined by coulomb counting over multiple charge and discharge training cycles. The wavelength shift of the internal sensor is compensated for temperature based on the external temperature sensor. The wavelength shift model is then determined by applying polynomial regression, or other statistical techniques, to the data set which includes the temperature-compensated wavelength shift, the current through the energy storage device, and the SOC of the energy storage device to find the best fit for the data.

Figure 2A:
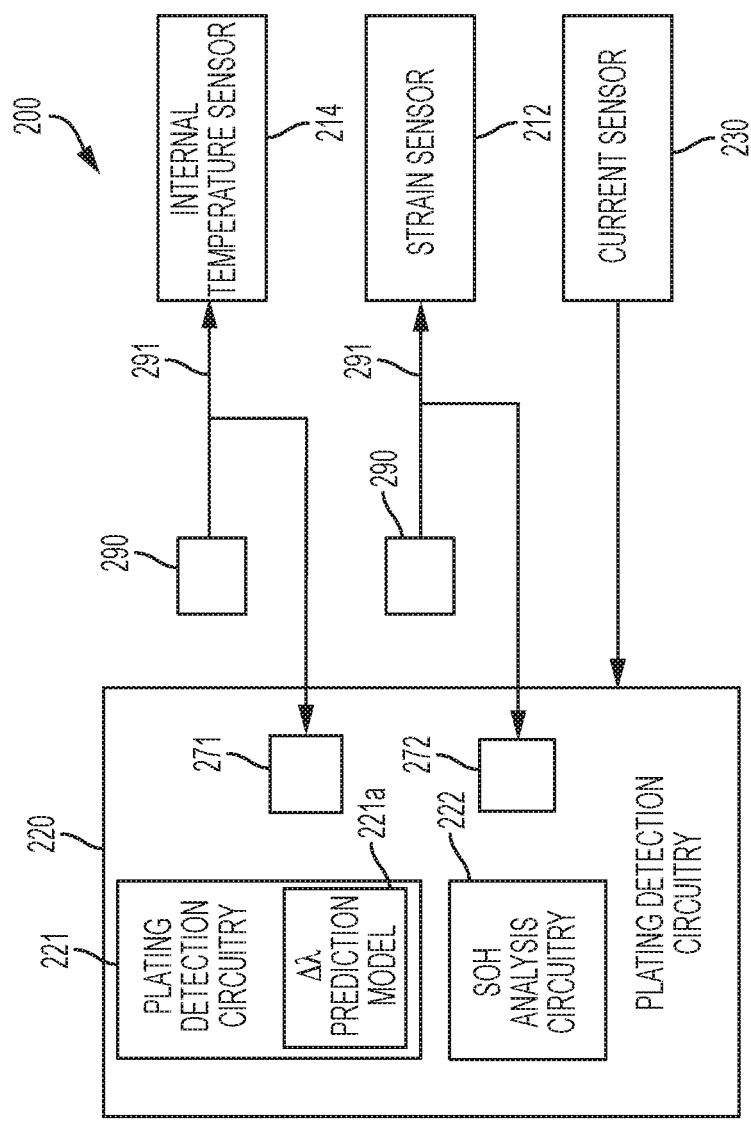
FIG. 2A is a block diagram of a metal ion plating detection system in accordance with some embodiments.

FIG. 2A is a block diagram of a system 200 configured to detect and/or predict metal ion plating events of an energy storage device and optionally to determine state of the health (SOH) indicators for the energy storage device. The system 200 includes plating monitoring circuitry 220 configured to detect, predict and/or analyze plating events. The monitoring circuitry 220 includes at least one wavelength shift detector 271, 272 and plating detection circuitry 221 configured to detect and/or predict plating events. The plating detection circuitry 221 includes a wavelength shift prediction model 221a developed as described above in connection with FIGS. 1B and 1C for example.

An optical strain sensor 212 is disposed on an FO cable disposed within or on the surface of an energy storage device and configured to exhibit a shift in the wavelength of the optical output of the optical sensor in response to strain. In some embodiments, the optical strain sensor 212 may be designed to provide a temperature-compensated output. In some embodiments, a separate temperature sensor 214 may be placed inside or outside the energy storage device to provide a temperature measurement for the energy storage device. The temperature measurement from the temperature sensor 214 is used to temperature-compensate the output of the strain sensor 212 as previously discussed. As shown in FIG. 2A, in some embodiments, the temperature sensor 214 is an optical sensor, however, the temperature sensor 214 can be any type of sensor that measures the temperature of the energy storage device near the location of the optical strain sensor 212.

To provide temperature-compensated strain measurements using separate strain and temperature sensors, two optical sensors, e.g., FBG sensors disposed on the same FO cable or separate FO cables, can be placed in close proximity, where the first sensor measures strain and is exposed to both strain and temperature within the energy storage device and a second sensor used for temperature compensation is exposed to temperature but not strain. The temperature measurement provided by the temperature sensor is used to compensate for changes in temperature in the strain measurement of the strain sensor. For example, the strain sensor may be placed within or on an electrode or cell wall or on the external surface of the energy storage device and the temperature sensor may be placed nearby and/or at any location having about equal temperature as the location of the strain sensor while being subjected to a known and/or non-varying strain. For example, the temperature sensor may be located near but not within the electrode or cell wall or may be located external to the energy storage device.

Light from the light source 290 is transmitted through the FO cable(s) 291 to the sensors 212, 214 where the transmitted light interacts with the sensors 214, 212. Light reflected from the sensors 212, 214 is detected and analyzed by the wavelength shift detector 271, 272. As an example, FBG strain and temperature sensors are formed by a periodic modulation of the refractive index along a finite length (typically a few mm) of the core of the FO cable. This pattern reflects a wavelength, called the Bragg wavelength that is determined by the periodicity of the refractive index profile of the FBG sensor. In practice, the sensor typically reflects a narrow band of wavelengths centered at the Bragg wavelength. The Bragg wavelength at a characteristic or base value of the external stimulus is denoted λ and light having wavelength λ (and a narrow band of wavelengths near λ) are reflected when the sensor is in the base condition. For example, the base condition may correspond to 25 degrees C. and/or zero strain. When the sensor is subjected to strain, the strain changes the periodicity of the grating and the index of refraction of the FBG, and thereby alters the reflected wavelength to a wavelength, λs, different from the base wavelength, λ. The resulting wavelength shift, $\Delta\lambda/\lambda = (\lambda-\lambda s)/\lambda$ is a direct measure of the stimulus. The wavelength shift $\Delta\lambda/\lambda$ of the reflected light is detected by wavelength shift detectors 271, 272.

The relation between wavelength shift ($\Delta\lambda/\lambda$) and simultaneous strain and temperature in an FBG sensor is:

$$\Delta\lambda/\lambda = \{1-n^2/2[p12-n(p11+p12)]\}\varepsilon 1 + [\alpha+1/n \ (dn/dT)]\Delta T \quad [1]$$

where n is the index of refraction, p11 and p12 are strain-optic constants, ε1 is longitudinal strain, α is the coefficient of thermal expansion and T is the temperature.

The system 200 also includes a current sensor 230 configured to sense the current load of the energy storage device. The current sensor 230 can be any suitable type of current sensor, such as a hall effect sensor, transformer, resistive sensor, optical current sensor etc. Current measurements for the approaches discussed herein need one or relatively few sense points. Thus, optical sensing of current using an optical current sensor can be particularly useful. The use of an optical current sensor eliminates the need for bulky electrical sensing and data conditioning circuitry to be employed in addition to fiber-optic/photonic sensing systems used to detect the wavelength shift of the optical strain sensor and/or the optical temperature sensor.

The plating detection circuitry 221 uses a stored model to predict the expected wavelength shift of the strain sensor for a given SOC. The SOC may be determined based on coulomb counting. Metal ion plating events are determined by the plating detection circuitry 221 based on the difference between the measured wavelength shift and the expected wavelength shift acquired from the wavelength prediction model. The measured wavelength shift may be temperature compensated based on the output of the temperature sensor. The wavelength shift prediction model provides an expected wavelength shift that is also temperature compensated as previously discussed.

In some embodiments, the system 200 includes a SOH analyzer 222 configured to assess the SOH of the energy storage device based on the detected plating events. For example, the SOH analyzer 222 may count the number of plating events, may determine a severity value for each plating event and/or may determine a cumulative severity value for multiple plating events. In some embodiments, the SOH analyzer 222 may be configured to provide a report or other output to an operator indicating the number and/or severity values of the plating events. The SOH analyzer 222 may compare the number of plating events and/or the severity value of the plating events to one or more plating event number thresholds and/or plating event severity value thresholds to develop SOH indicators for the energy storage device.

Figure 2B:
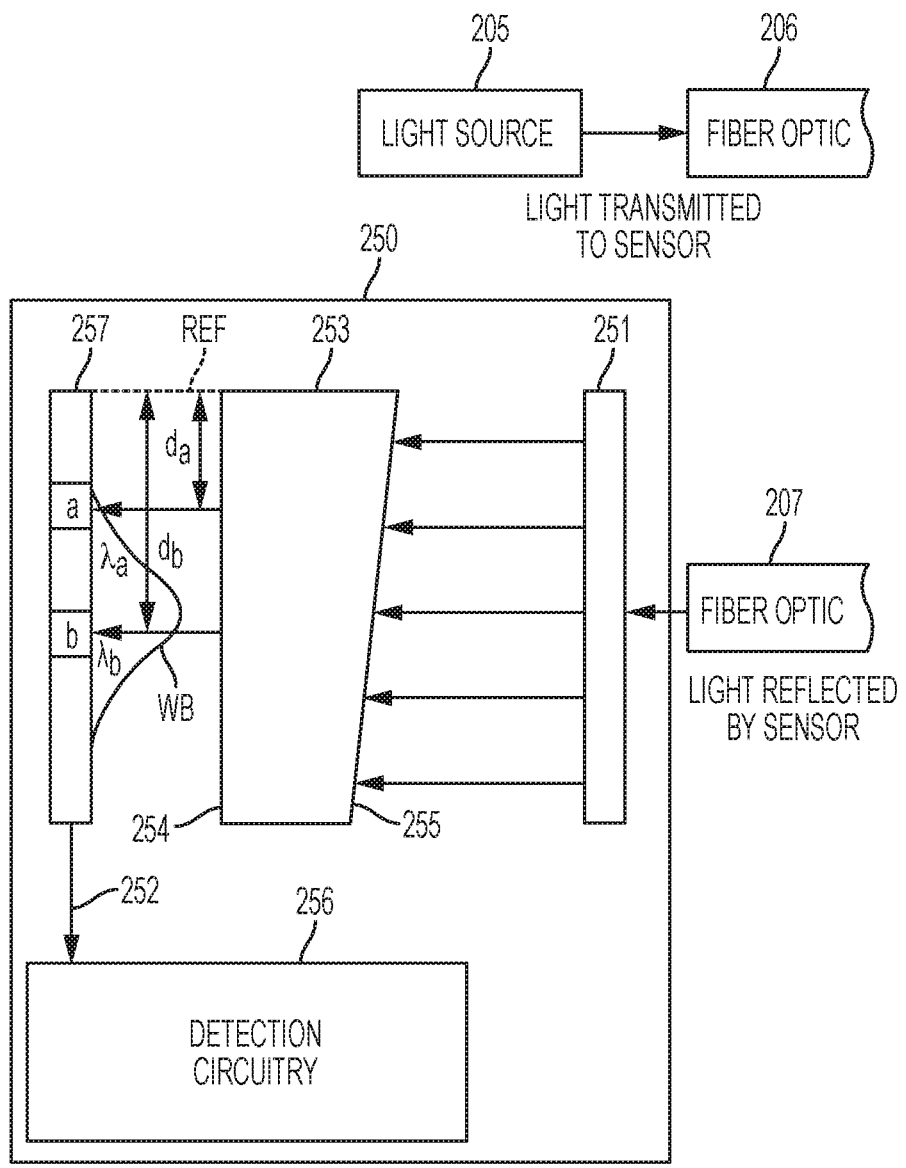
FIGS. 2B and 2C are block diagrams of wavelength shift detectors that can be used in the plating detection system of FIG. 2A in accordance with some embodiments.
Figure 2C:
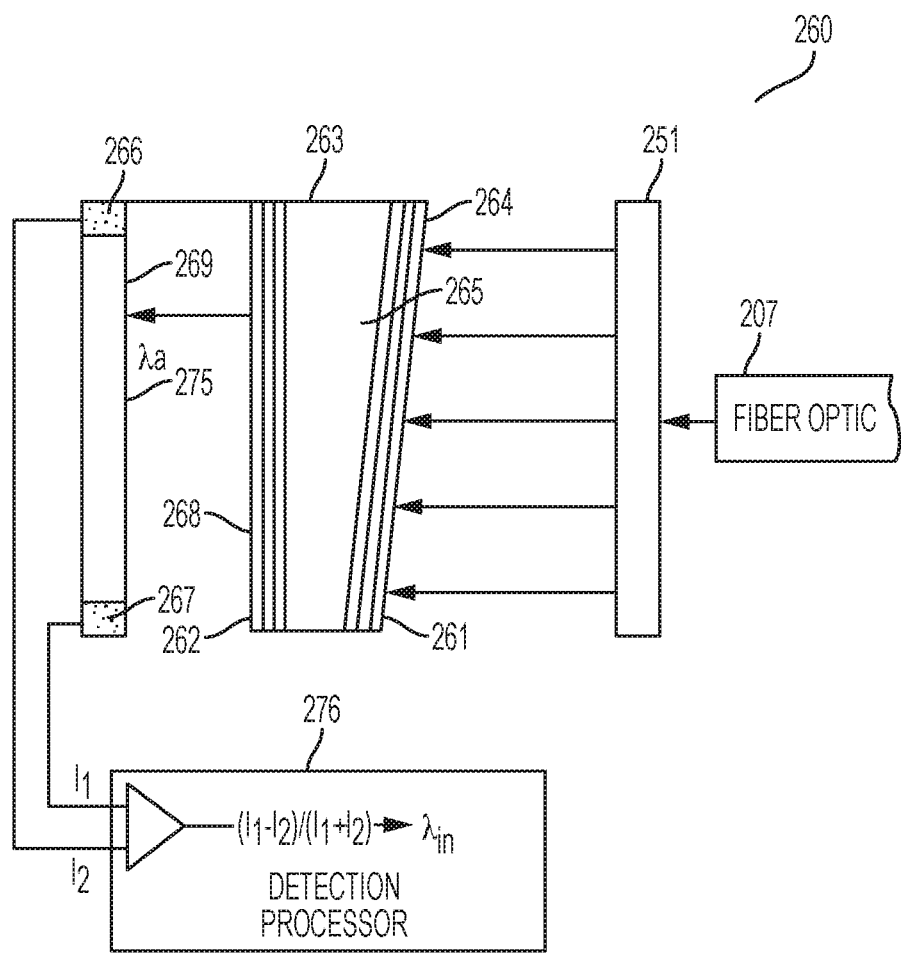

FIG. 2B and FIG. 2C show block diagrams of wavelength shift detectors that may be used as detectors 271, 272 in FIG. 2A. The block diagram of FIG. 2B illustrates portions of a light source 205 and wavelength shift detector 250 that can be used to detect the shift in wave length of an optical signal received from an FO cable having an optical sensor disposed thereon. The light source 205 transmits input light to the sensor (not shown in FIG. 2B) via FO cable 206. The wavelength shift detector (WSD) 250 includes various components that may optionally be used to analyze the light reflected by the sensor and propagated by FO cable 207.

The WSD 250 includes an optional spreading component 251 configured to collimate and/or spread the light from the FO cable 207 across an input surface 255 of a linearly varying transmission structure (LVTS) 253. In arrangements where sufficient spreading of the light occurs from the FO cable 207, the spreading component may not be used. The LVTS 253 may comprise a dispersive element, such as a prism, or linear variable filter. The LVTS 253 receives light at its input surface 255 (from the FO cable 207 and (optionally) the spreading component 251) and transmits light from its output surface 254. The wavelength of the light varies with distance along the output surface 254 of the LVTS 253.

FIG. 2B shows central wavelengths of two wavelength bands, a first wavelength band has a central wavelength of $\lambda_a$ emitted at distance $d_a$ from a reference position (REF) along the output surface 254. The second wavelength band has a central wavelength $\lambda_b$ and is emitted at distance $d_b$ from the reference position. For example, a strain sensor may transmit light at central wavelength $\lambda_a$ when subjected to a first amount of strain and may transmit light at central wavelength $\lambda_b$ when subjected to a second amount of strain.

A position sensitive detector (PSD) 257 is positioned relative to the LVTS 253 so that light transmitted through the LVTS 253 falls on the PSD 257. For example, light in the wavelength band having central wavelength $\lambda_a$ falls on region a of the PSD 257 and light in the wavelength band having central wavelength $\lambda_b$ falls on region b of the PSD 257. The PSD 257 generates an electrical signal along output 252 that includes information about the position (and thus the wavelength) of the light output from the LVTS. The output signal from the PSD 257 is used by the detection circuitry 256 to detect shifts in the wavelength of light reflected by the sensor.

The PSD 257 may be or comprise a non-pixelated detector, such as a large area photodiode, or a pixelated detector, such as a photodiode array or charge coupled detector (CCD). Pixelated one-dimensional detectors include a line of photosensitive elements whereas a two-dimensional pixelated detector includes an n×k array of photosensitive elements. Where a pixelated detector is used, each photosensitive element, corresponding to a pixel, can generate an electrical output signal that indicates an amount of light incident on the element. The detection circuitry 256 may be configured to scan through the output signals to determine the location and location changes of the light transmitted through the LVTS 253. Knowing the properties of the LVTS 253 allows the peak wavelength and shift of the peak wavelength of light transmitted through the LVTS 253 to be determined. The wavelength shift in reflected light from the sensor can be detected as a shift of the light transmitted through the LVTS 253 at location a or b. This can, for example, be accomplished by determining the normalized differential current signal of certain pixels or pixel groups of the PSD 257.

For example, consider the example in which a light spot having an intensity vs. wavelength characteristic WB is incident on the PSD 257. $I_a$ is the current generated by the light spot in the PSD 257 at position a and $I_b$ is the current generated by the light spot in the PSD 257 by light spot at location b. The normalized differential current signal generated by pixels or pixel groups at locations a and b can be written $(I_a-I_b)/(I_a+I_b)$, which indicates the position of light spot on the PSD 257. A shift in the wavelength band of the light spot changes the position of light spot on the PSD 257 which in turn changes the normalized differential current signal $(I_a-I_b)/(I_a+I_b)$.

FIG. 2C is a block diagram illustrating portions of a wavelength shift detector (WSD) 260 that includes a non-pixelated, one-dimensional PSD 275. The WSD 260 includes an optional spreading component 251 as previously discussed. The spreading component 251 is configured to collimate and/or spread the light from the FO cable 207 across an input surface 261 of a linearly varying transmission structure (LVTS) 263. In the implementation depicted in FIG. 2C, the LVTS 263 comprises a linear variable filter (LVF) having layers that may be deposited on the PSD 275 to form an integrated structure. The LVF 263 in the illustrated example comprises two mirrors, e.g., distributed Bragg reflectors (DBRs) 264, 268 that are spaced apart from one another to form optical cavity 265. The DBRs 264, 268 may be formed, for example, using alternating layers of high refractive index contrast dielectric materials, such as $SiO_2$ and $TiO_2$. One of the DBRs 264 is tilted with respect to the other DBR 268 forming an inhomogeneous optical cavity 265. It will be appreciated that the LVF may alternatively use a homogeneous optical cavity when the light is incident on the input surface at an angle.

The PSD 275 shown in FIG. 2C is representative of a non-pixelated, one-dimensional PSD although two-dimensional, non-pixelated PSDs (and one or two-dimensional pixelated PSDs) are also possible. The PSD 275 may comprise, for example, a large area photodiode comprising a semiconductor such as InGaAs. Two contacts 266, 267 are arranged to run along first and second edges of the semiconductor of the PSD 275 to collect current generated by light incident on the surface of the PSD 275. When a light spot 269 is incident on the PSD 275, the contact nearest the light spot collects more current and the contact farther from the light spot collects a lesser amount of current. The current from the first contact 266 is denoted $I_2$ and the current from the second contact 267 is denoted $I_1$. The detection circuitry 276 is configured to determine the normalized differential current, $(I_2-I_1)/(I_2+I_1)$, the position of the transmitted light spot, and therefore the predominant wavelength of the light incident at the input surface 261 of the LVTS 263 can be determined. The predominant wavelength may be compared to previous wavelengths to determine an amount of shift in the wavelength of the light spot. The shift in the wavelength can be correlated to a change in the sensed strain.

EXAMPLE

The following example illustrates a real-time approach for detecting lithium plating events and/or SOH indicators of battery cells. The batteries used in the example were 1.6 Amp hour $LiCoO_2$ (LCO) cells, however, it will be appreciated that the approach can be used for any lithium batteries to detect plating events. The training data used to develop the SOC estimation model included standard charge and fixed load discharge cycles interleaved with dynamic cycles of standard charge followed by an Urban Dynamometer Driving Schedule (UDDS) derived city discharge profile. It will be appreciated that other training cycles could be used depending on the application.

Figure 3:
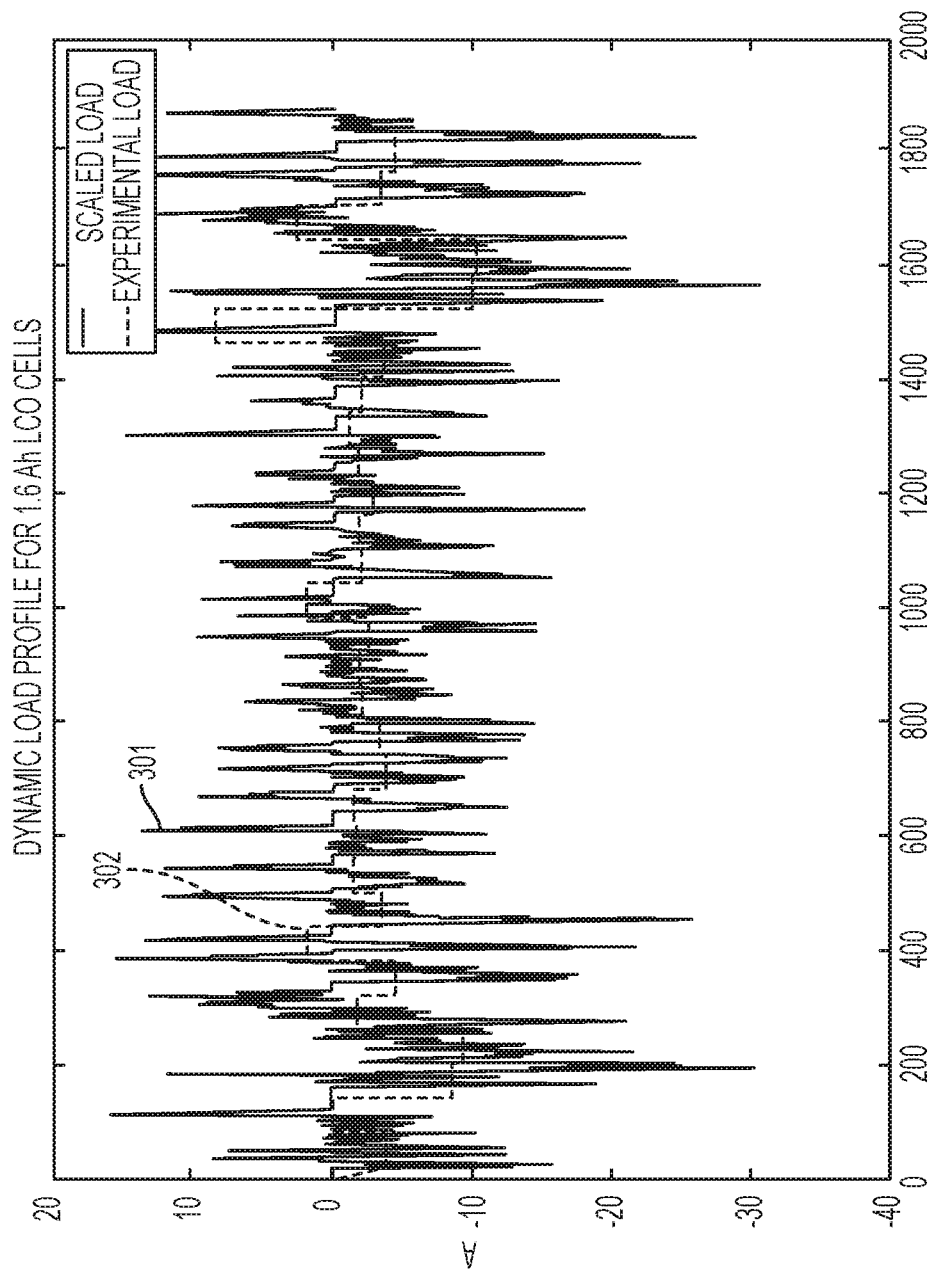
FIG. 3 is a graph illustrating a sampled and scaled dynamic load profile for cycling small format battery cells in accordance with some embodiments.

The 1.6 Ah $LiCoO_2$ cells were cycled to generate training data. The training cycles include standard charge and fixed load discharge cycles interleaved with dynamic cycles of standard charge followed by the UDDS discharge profile. UDDS is commonly called the "LA4" or "the city test" and represents city driving conditions. The UDDS profile is generally used for light duty vehicle testing. FIG. 3 shows the sampled and scaled dynamic load profile from cycling the small format 1.6 Ah LCO cells. In this particular example, some modifications to the original profile (scaled load plot 301) were performed to accommodate the 1-minute sample-and-hold and 10 A (per channel) maximum load specifications of the battery cycler used. The experimental load is shown in plot 302.

Figure 4:
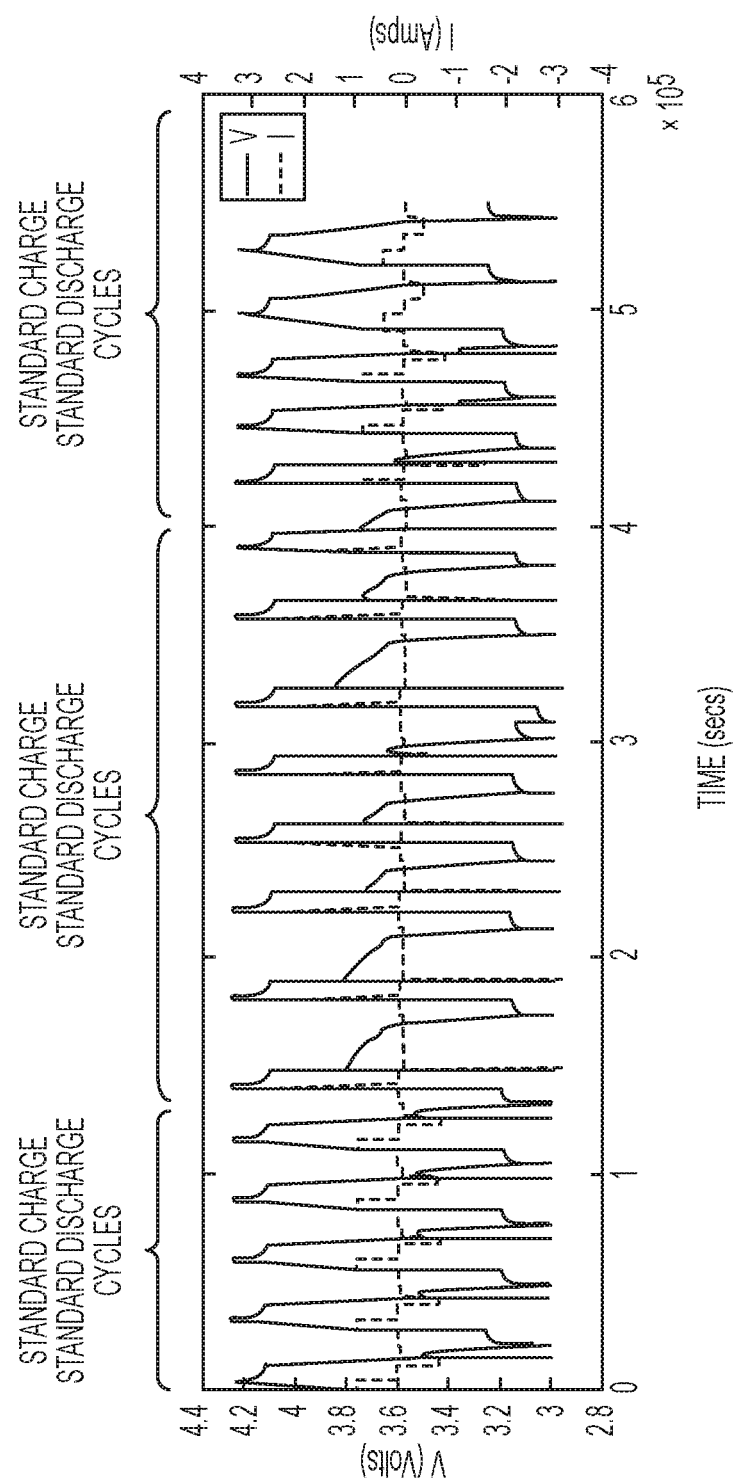
FIG. 4 is a graph showing interleaved standard-charge-and-discharge and standard-charge-dynamic-discharge profile for battery cells in accordance with some embodiments.
Figure 5A:
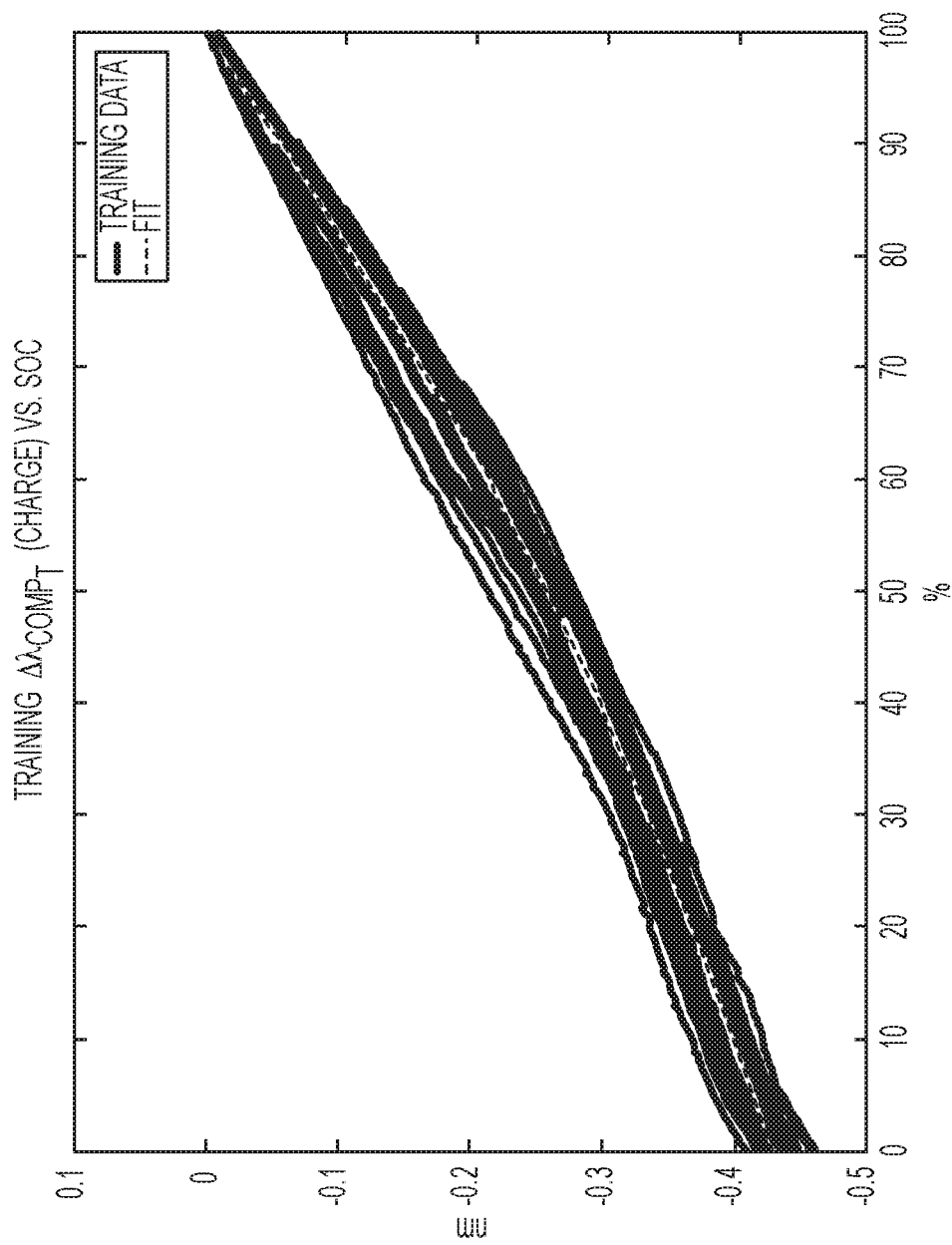
FIGS. 5A and 5B are graphs respectively showing training cycle data obtained for charge cycles and discharge cycles in accordance with some embodiments.
Figure 5B:
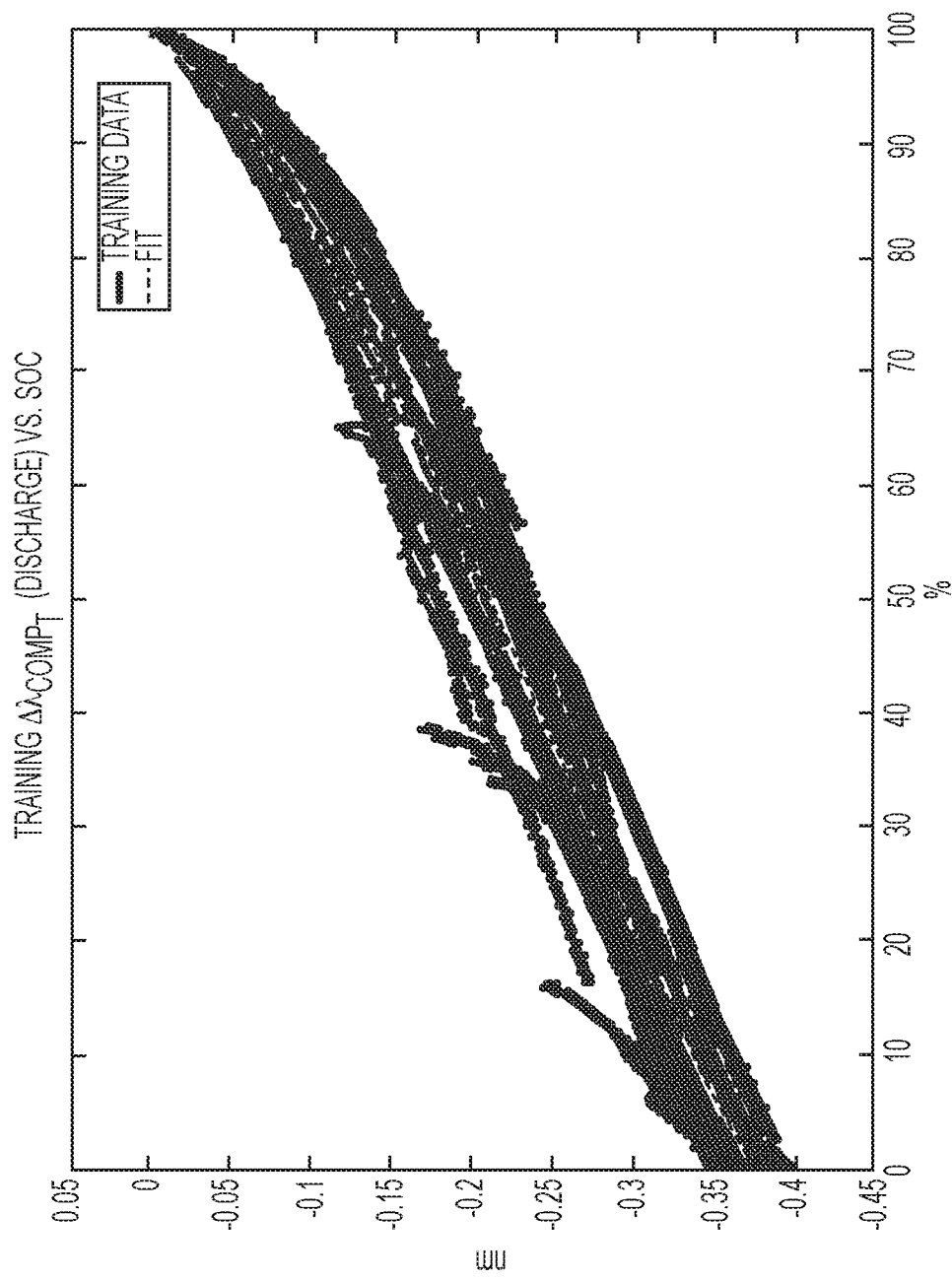

The interleaved standard-charge-and-discharge profile and standard-charge-dynamic-discharge profile, used as training cycles, imposed on 1.6 Ah LCO cells are shown in FIG. 4. The training data, including SOC and wavelength shift values, for charge and discharge training cycles are shown in FIGS. 5A and 5B, respectively.

Estimating cell SOC at run-time involved using the temperature-compensated wavelength shift of the signal coming from an internally embedded Fiber Bragg Grating (FBG) strain sensor disposed on an FO cable. The SOC was estimated using a model that relates SOC to wavelength shift as previously discussed. In this example, the SOC was determined for a given wavelength shift based on a model developed using polynomial regression. This example fit a polynomial regression model for SOC to powers of temperature-compensated wavelength shift from an internally embedded FBG by the method of linear least squares. An external loose FBG sensor was used as the temperature compensating sensor. The polynomial regression model was subsequently used to estimate SOC for a given value of temperature-compensated wavelength shift.

Figure 6A:
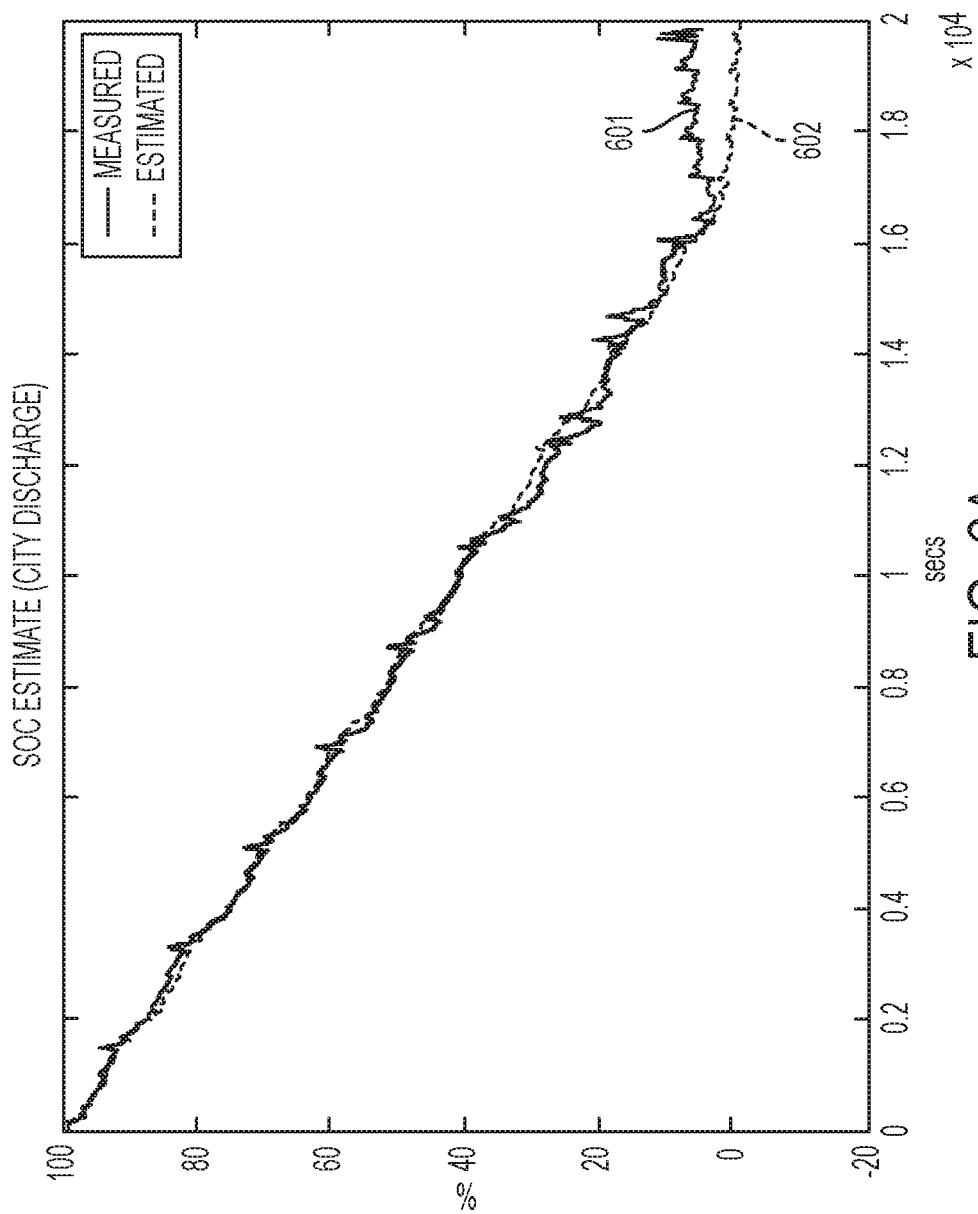
FIG. 6A shows a polynomial regression-based state of charge (SOC) estimation in accordance with some embodiments.
Figure 6B:
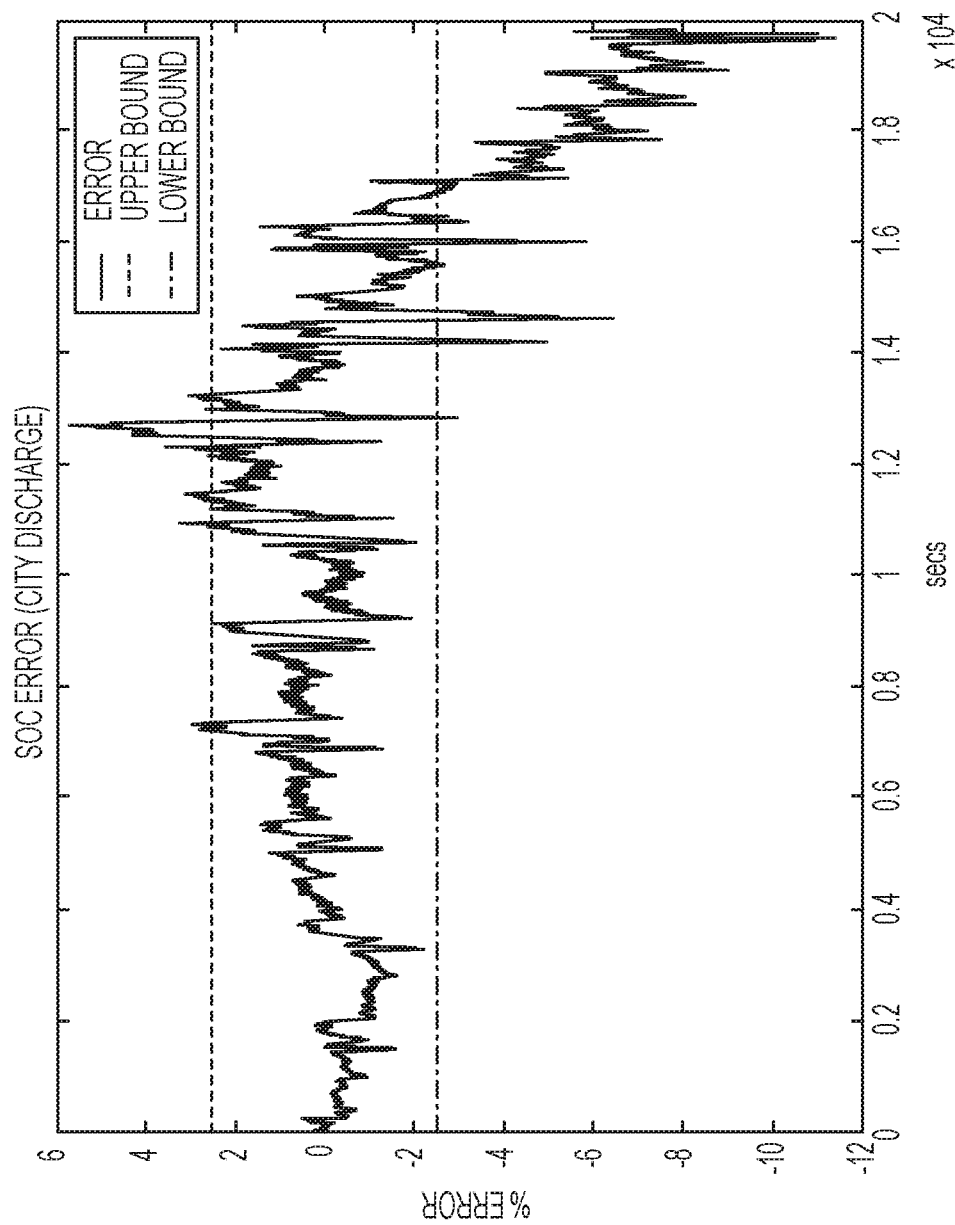
FIG. 6B shows the error in run-time estimation of SOC using the polynomial regression based model of FIG. 6A.

The performance of this polynomial regression-based estimation method is shown in FIG. 6A for the UDDS/City profile-derived dynamic discharge. The order of the polynomial used in this particular example was 6, but a different order of the polynomial could be used depending on implementation. Plot 601 is the measured SOC with respect to time and plot 602 is the SOC estimated using the polynomial regression model. FIG. 6B is a plot of the error between the measured and estimated SOC showing 2.5% error upper and lower bounds. Run-time SOC estimation with 2.5% accuracy was achieved for almost the full range of SOC as shown in FIG. 6B.

Figure 7:
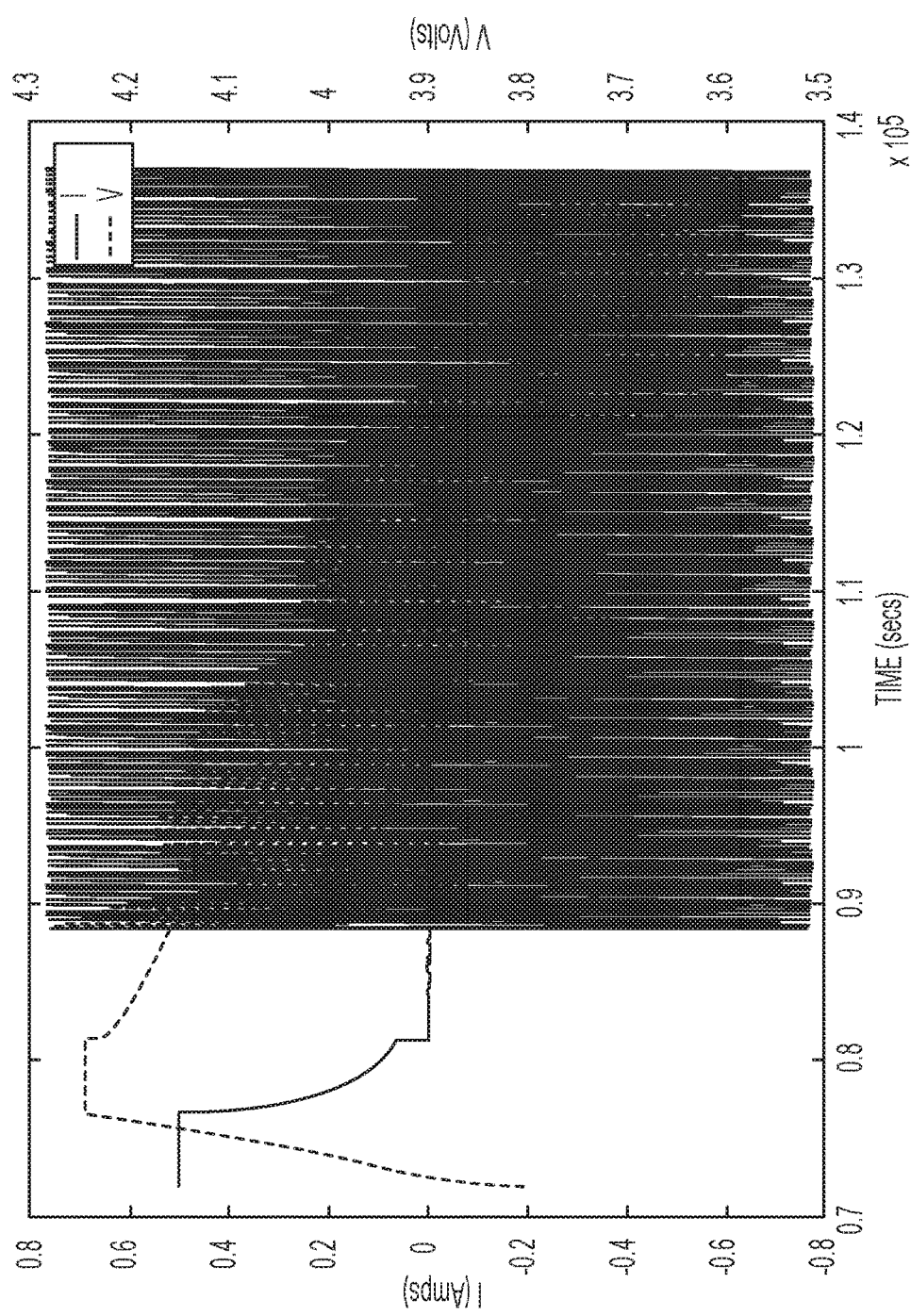
FIG. 7 is a plot of current and voltage of a battery cell as a function of time for a discharge cycle showing the transient phenomena at high frequency load changes.
Figure 8:
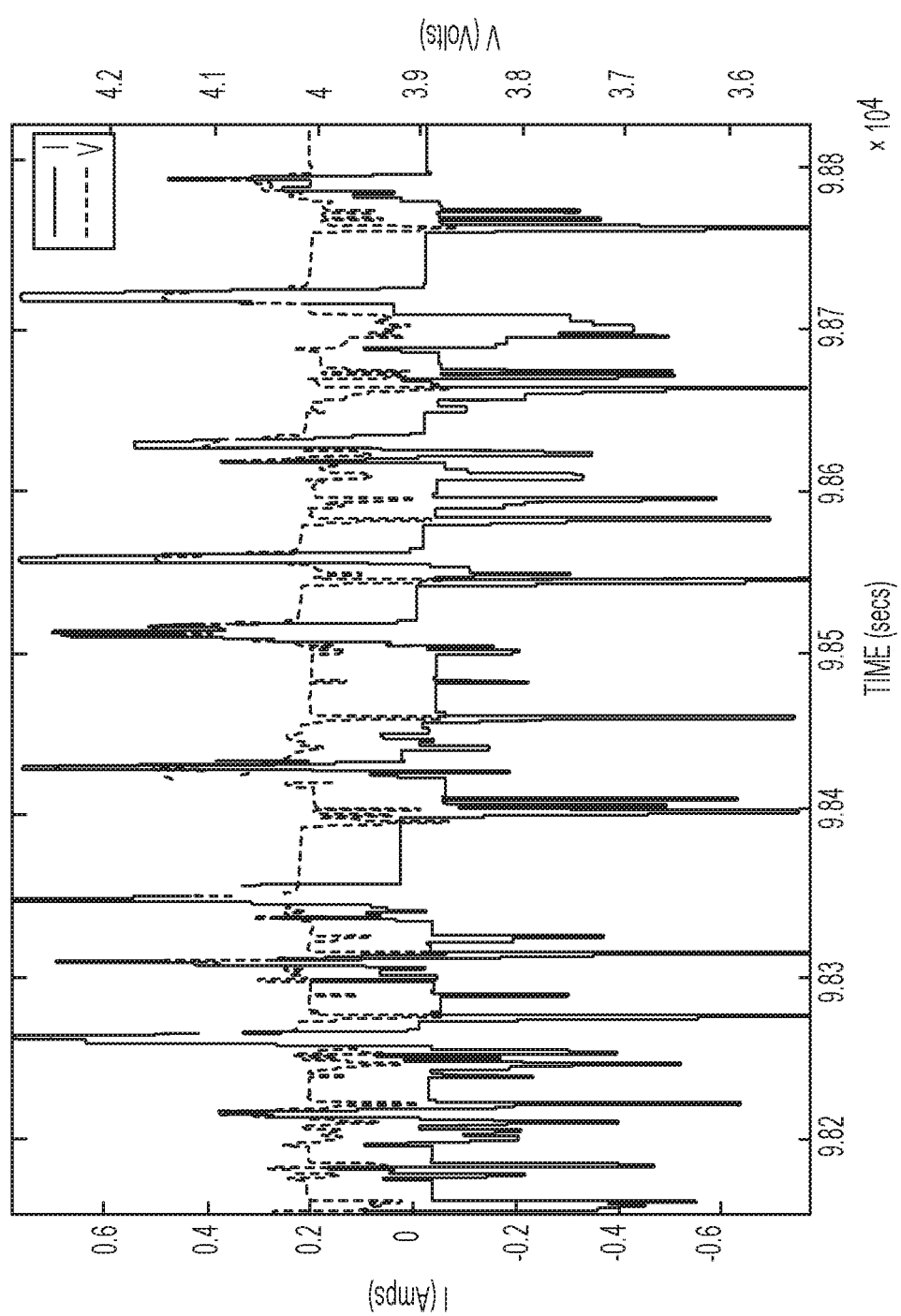
FIG. 8 provides a detailed view of a portion of the plot of FIG. 7.

The one-minute hold times on the load current (see FIG. 3) allowed the transient dynamics to settle and the estimated SOC to catch up with the real SOC. However, once the one-minute hold times were removed, the UDDS charge sustaining cycle was harder to estimate SOC with error within prescribed limits due to high slew rates between charging and discharging segments and the lack of a cell internal temperature sensor in this particular experiment. With higher slew rates, the difference between cell internal and external temperatures can be significant. Where an internal temperature sensor is used, such a current compensation may not be needed. FIG. 7 is a plot of voltage and current of a battery cell as a function of time for the UDDS cycle showing the transient phenomena at high frequency load changes. FIG. 8 is an detailed view of the plot of FIG. 7 for the time period between about 9.82 and $9.88 \times 10^4$ seconds.

Figure 9:
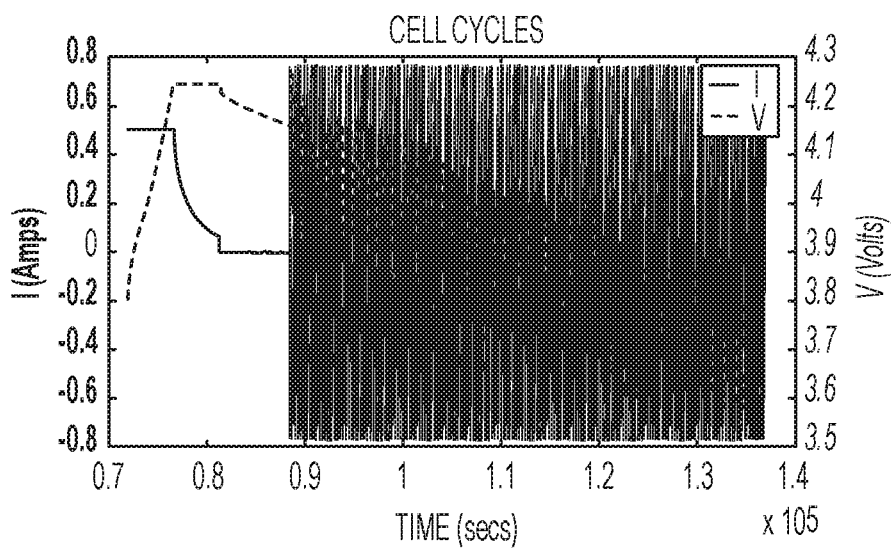
FIG. 9 shows the current and voltage with respect to time for a charge/discharge cycle during which lithium plating does not occur.
Figure 10:
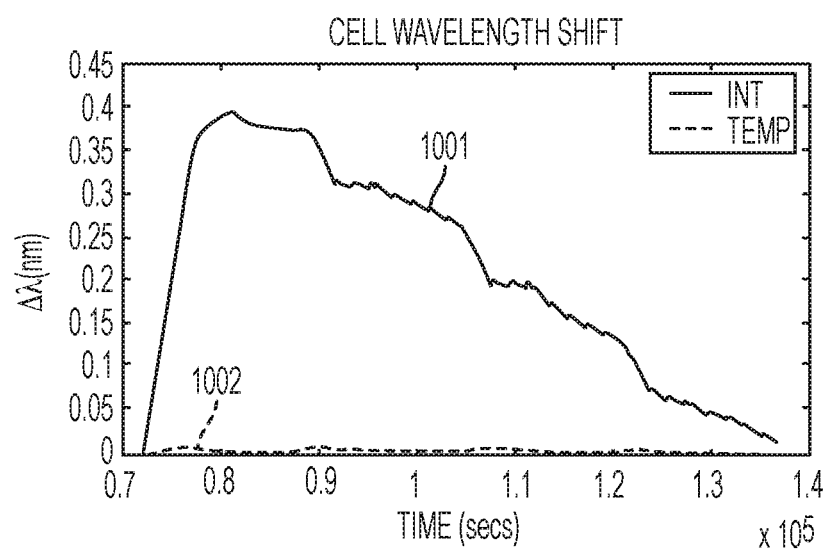
FIG. 10 shows a plot of the wavelength shift of the internal strain sensor with respect to time and a plot of the of the wavelength shift of an external sensor measuring temperature during the charge/discharge cycle of FIG. 9.

In the absence of an internal fiber-optic temperature sensor for this particular experiment, by including current compensation to the SOC estimation, the SOC error can be brought to within the 2.5% error bounds even for the high slew rate UDDS cycle, as shown in FIGS. 9 through 12. FIG. 9 shows the current and voltage with respect to time for a UDDS cycle during which lithium plating does not occur. FIG. 10 shows a plot 1001 of the wavelength shift of the internal FO sensor 1001 with respect to time measuring strain and a plot of the 1002 of the wavelength shift of the external FO sensor measuring temperature.

Figure 11:
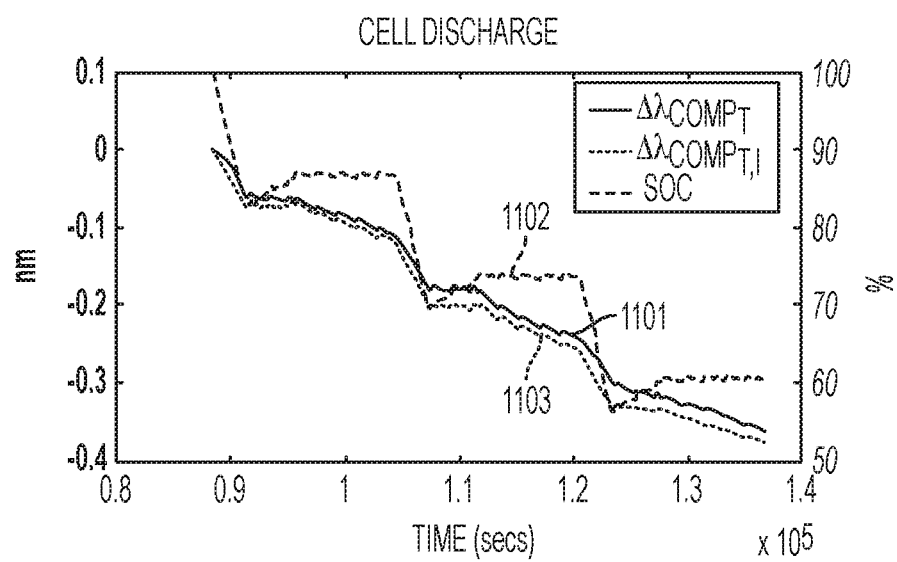
FIG. 11 shows a plot of the wavelength shift of the strain sensor output compensated for temperature, a plot of the SOC after compensating for current load, and a plot of the expected wavelength shift which includes compensation for both temperature and current load.
Figure 12:
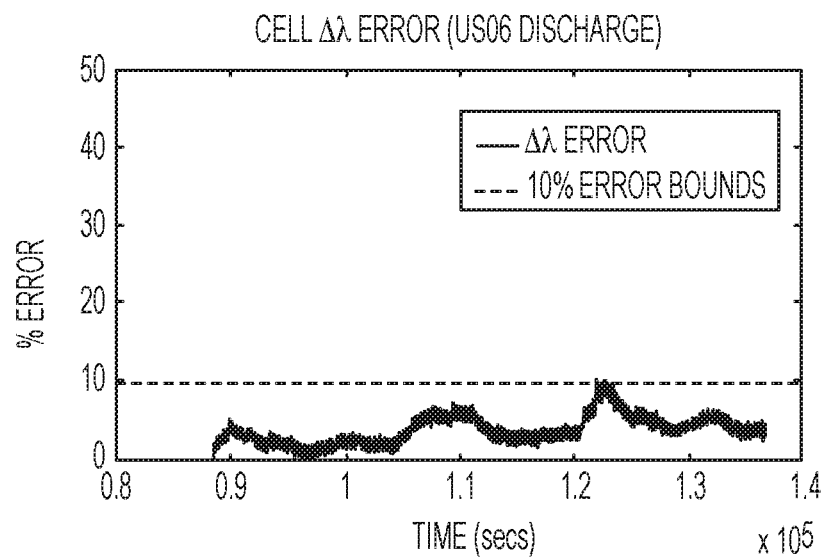
FIG. 12 is a plot of the percentage error between the temperature compensated measured wavelength shift signal and the expected wavelength shift given the load current.

The expected wavelength shift compensated for the current and corresponding to the SOC was determined from a the model previously developed by polynomial regression as discussed above. FIG. 11 shows plot 1101 of the measured wavelength shift of the strain sensor output; plot 1102 of the SOC; and plot 1103 showing the expected wavelength shift which includes compensation for both temperature and current load. FIG. 12 is a plot of the percentage error between the measured wavelength shift signal and the expected wavelength shift given the load current and cell temperature.

Figure 13:
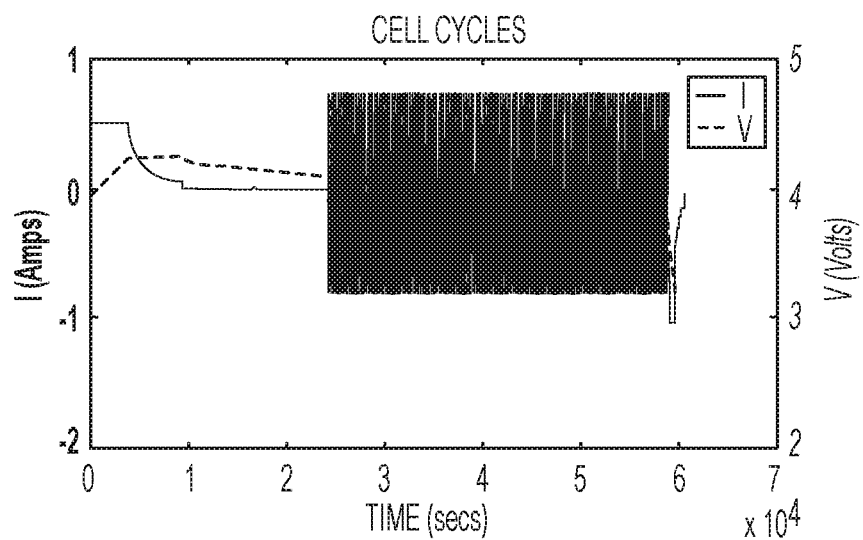
FIG. 13 shows the current and voltage with respect to time for a battery cycle during which lithium plating occurs.
Figure 14:
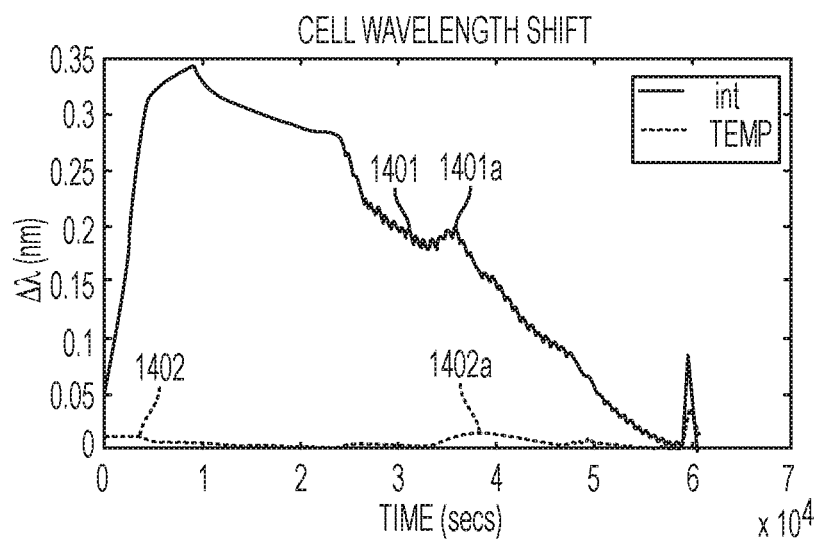
FIG. 14 shows a plot of the wavelength shift of the internal sensor with respect to time measuring strain and a plot of the of the wavelength shift of the sensor measuring temperature.
Figure 15:
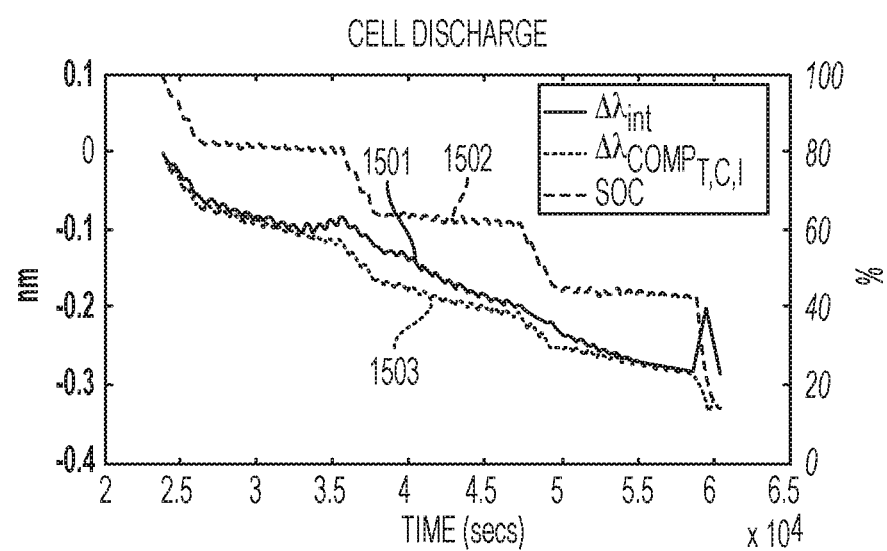
FIG. 15 shows a plot of the wavelength shift of the strain sensor output compensated for temperature, a plot of the SOC after compensating for current, and a plot of the expected wavelength shift which includes compensation for both temperature and current.
Figure 16:
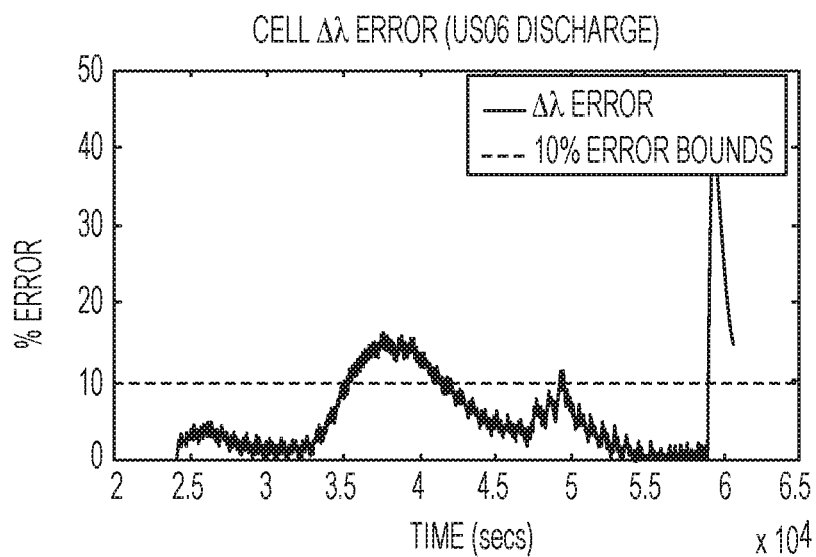
FIG. 16 is a plot of the percentage error between the temperature compensated measured wavelength shift signal and the expected wavelength shift given the current indicating a lithium plating event.

When a lithium plating event occurs e.g., due to some high slew rate charging event, such as during the UDDS cycle (representing a braking event), the effects of the plating described herein causes a rise in internal temperature and strain leading to the wavelength shift of the signal at the output of the internal optical strain sensor to rise higher than the expected wavelength shift. The effect of the internal temperature and strain due to lithium plating is illustrated in FIGS. 13 through 16. In the experimental process, the occurrence of lithium plating was verified by post-mortem analysis on the affected battery cell. FIG. 13 shows the current and voltage with respect to time for a UDDS cycle during which lithium plating occurs. FIG. 14 shows a plot 1401 of the wavelength shift of the internal FO sensor with respect to time measuring strain and a plot of the 1402 of the wavelength shift of the external FO sensor measuring temperature. The peak morphology 1401a, 1402a in plots 1401, 1402 indicate excess strain and heat caused by the plating. FIG. 15 includes plot 1501 showing the wavelength shift of the strain sensor output; plot 1502 showing the SOC; and plot 1503 showing the expected wavelength shift which includes compensation for both temperature and current load. The difference between the measured wavelength shift in plot 1501 and the expected wavelength shift in plot 1503 between at about 3 and $5.5 \times 10^4$ seconds indicates a lithium plating event. FIG. 16 is a plot of the percentage error between the measured wavelength shift signal and the expected wavelength shift given the load current. The error, above the threshold of 10%, indicates a lithium plating event.

Lithium plating can reduce battery lifetime and impact safety. This makes avoidance or at least early detection of lithium plating during battery usage desirable for battery and battery-powered system manufacturers and operators. The approach disclosed herein provides a test for lithium plating under a variety of usage conditions and can be used to evaluate chemical additives or novel electrode materials and structures, and/or identify the limiting aggressive loads/use cases to inhibit lithium plating. For battery-powered system manufacturers and operators, such as electric vehicle manufactures and drivers, detecting lithium plating in real-time is desirable so that ameliorating control actions such as isolating affected cells or strings in the battery pack from the power path can be employed. Other actions such as reducing the load current and/or boosting ion mobility (such as via temperature increase, accounting for other possible adverse effects) may also be taken.

Systems, devices, or methods disclosed herein may include one or more of the features, structures, methods, or combinations thereof described herein. For example, a device or method may be implemented to include one or more of the features and/or processes described herein. It is intended that such device or method need not include all of the features and/or processes described herein, but may be implemented to include selected features and/or processes that provide useful structures and/or functionality.

In the above detailed description, numeric values and ranges are provided for various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various implementations. These materials are to be treated as exemplary, and are not intended to limit the scope of the claims.

The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

The invention claimed is:

1. A method, comprising:
measuring a wavelength shift in an output of an optical sensor disposed internally or externally within a metal ion energy storage device, the wavelength shift responsive to internal strain within the metal ion energy storage device;
estimating a state of charge (SOC) of the metal ion energy storage device;
determining an expected wavelength shift based on the estimated SOC;
determining a difference between the expected wavelength shift and the measured wavelength shift; and
detecting and/or predicting metal ion plating within the energy storage device based on the difference.

2. The method of claim 1, wherein the wavelength shift is compensated for temperature based on an output of an internal temperature sensor.

3. The method of claim 1, wherein the wavelength shift is compensated for temperature based on an output of an external temperature sensor and the current.

4. The method of claim 1, further comprising developing a model relating the SOC of the metal ion energy storage device to the expected wavelength shift.

5. The method of claim 4, wherein developing the model involves using machine learning mapping the SOC to a wavelength shift over multiple charge and discharge training cycles of the metal ion energy storage device.

6. The method of claim 5, wherein correlating the SOC to the wavelength shift involves performing a polynomial fit of the SOC and the wavelength shift over the multiple training cycles.

7. The method of claim 1, wherein detecting the metal ion plating comprises detecting or predicting the metal ion plating based on a function of the difference with respect to time.

8. The method of claim 7, wherein the function is a moving average of the difference with respect to time.

9. The method of claim 7, wherein the function is a derivative of the difference with respect to time.

10. The method of claim 1, further comprising determining one or more state of health indicators of the metal ion energy storage device based on the metal ion plating.

11. The method of claim 10, wherein the one or more state of health indicators comprises one or more of cycle life of the metal ion energy storage device, capacity of the metal ion energy storage device, and amount of active metal ions in the metal ion energy storage device.

12. The method of claim 1, further comprising predicting one or more of end of life and remaining useful life of the metal ion energy storage device based on the metal ion plating.

13. A system, comprising:
an optical sensor disposed internally within or externally on a metal ion energy storage device, the optical sensor having an optical output that changes in response to strain within the metal ion energy storage device;
a current sensor configured to detect current through the metal ion energy storage device; and
plating detection circuitry configured to:
measure a wavelength shift in the optical output of the optical sensor;
estimate a state of charge (SOC) of the metal ion energy storage device based on the detected current;
determine an expected wavelength shift from the estimated SOC;
determine a difference between the expected wavelength shift and the measured wavelength shift; and
detect and/or predict metal ion plating within the metal ion energy storage device based on the difference.

14. The system of claim 13, further comprising an internal temperature sensor disposed within the metal ion energy storage device and configured to measure internal temperature of the metal ion energy storage device, wherein the expected wavelength shift is compensated for the internal temperature.

15. The system of claim 13, further comprising an external temperature sensor disposed outside the metal ion energy storage device and configured to measure external temperature of the metal ion energy storage device, wherein the expected wavelength shift is compensated for external temperature and current.

16. The system of claim 13, wherein the current sensor is an electrical current sensor.

17. The system of claim 13, wherein the current sensor is an optical current sensor.

18. The system of claim 13, wherein the plating detection circuitry is configured to determine one or more state of health indicators of the metal ion energy storage device based on the metal ion plating.

19. The system of claim 18, wherein the one or more state of health indicators comprises one or more of cycle life of the metal ion energy storage device, capacity of the metal ion energy storage device, amount of active metal ions in the metal ion energy storage device.

20. The system of claim 13, wherein the plating detection circuitry is configured to predict one or more of end of life and remaining useful life of the metal ion energy storage device based on the metal ion plating.

21. The system of claim 13, wherein the metal ion energy storage device is a lithium ion battery cell.

22. The system of claim 13, wherein the metal ion energy storage device is a supercapacitor.

* * * * *